(12) United States Patent
Hsin et al.

(10) Patent No.: US 8,564,450 B2
(45) Date of Patent: Oct. 22, 2013

(54) MONITOR APPARATUS AND METHOD FOR DETECTING MOVEMENT BEHAVIOR OF OBJECT IN CYLINDER

(75) Inventors: Wei-Chen Hsin, Hsinchu County (TW); Ko-Wen Chiu, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 336 days.

(21) Appl. No.: 13/016,152

(22) Filed: Jan. 28, 2011

(65) Prior Publication Data

US 2012/0194349 A1 Aug. 2, 2012

(51) Int. Cl.
- G08B 21/00 (2006.01)
- G01B 7/14 (2006.01)
- G01M 15/00 (2006.01)

(52) U.S. Cl.
USPC ............ 340/686.1; 340/665; 324/207.19; 324/174; 324/225; 73/114.01; 73/488

(58) Field of Classification Search
USPC .......... 340/686.1, 686.3, 686.4, 524; 701/101–124, 29.1, 29.4, 29.5, 30.4, 701/30.5, 30.6, 31.1, 50; 73/114.01–114.81, 46, 488, 764, 73/864.16, 1.16, 1.19; 312/223.2; 91/393, 91/397, 433, 392, 403, 395, 407, 408, 409, 91/405, 71; 60/527; 324/207.19, 207.13, 324/207.12, 207.2, 207.24, 207.7, 207.16, 324/174, 225; 348/135, E7.085
See application file for complete search history.

(56) References Cited

U.S. PATENT DOCUMENTS

| 5,236,485 A * | 8/1993 | Leweringhaus et al. ....... 65/29.1 |
| 2007/0193653 A1 * | 8/2007 | Gagliano et al. ............. 141/256 |

* cited by examiner

*Primary Examiner* — Daniel Wu
*Assistant Examiner* — Mancil Littlejohn
(74) *Attorney, Agent, or Firm* — Ding Yu Tan

(57) ABSTRACT

An object is set to move back and forth between a first position and a second position in a cylinder. A measurement point between the first position and the second position is preset. A counted period indicating a duration that the object moves from the first position to the first measurement point is obtained. Then a movement behavior parameter is obtained according to the counted period. Whether the movement behavior parameter of the object matches a specified condition is determined. If matching occurs, a warning message is generated.

17 Claims, 3 Drawing Sheets

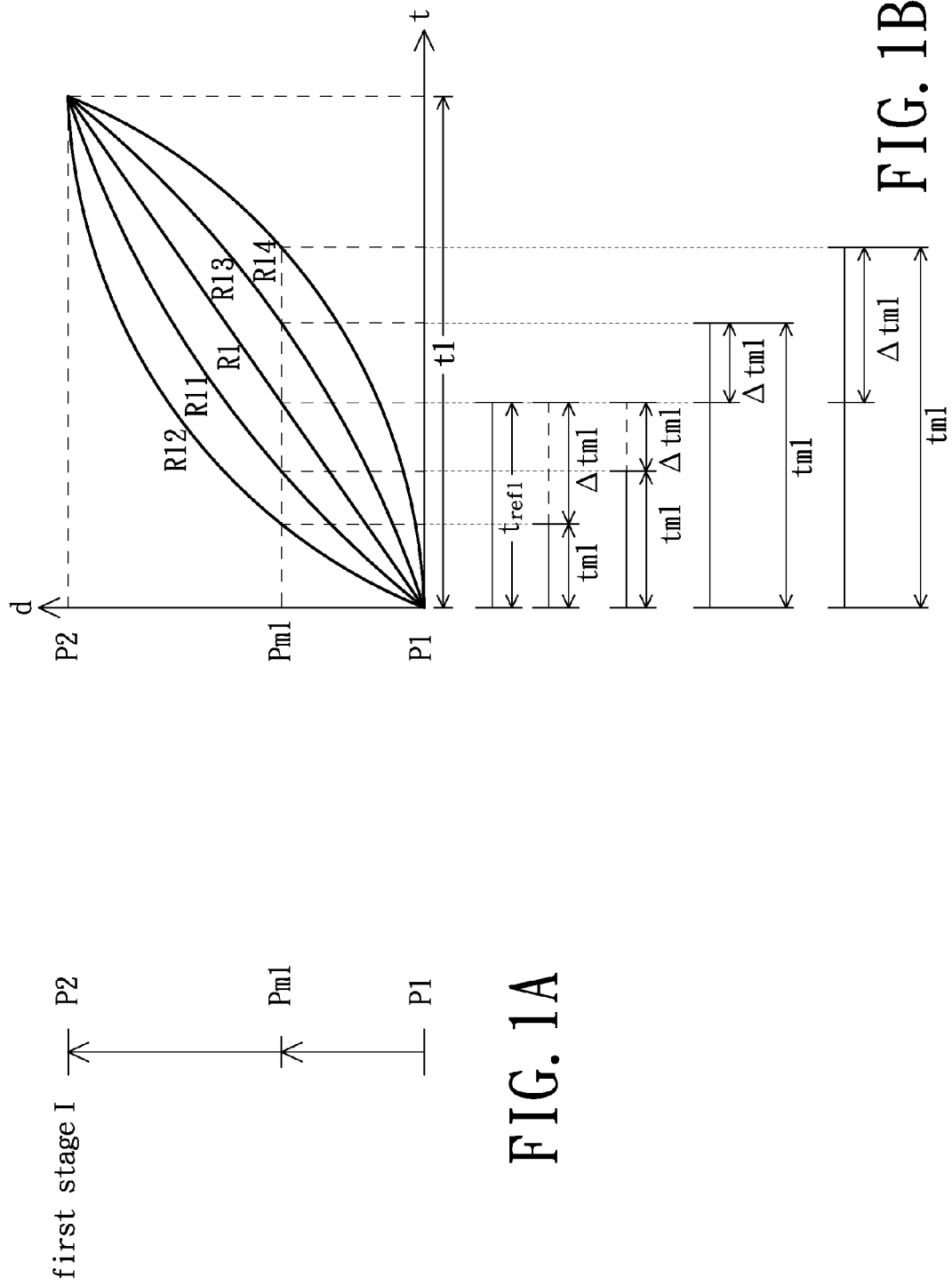

MONITOR APPARATUS AND METHOD FOR DETECTING MOVEMENT BEHAVIOR OF OBJECT IN CYLINDER

FIELD OF THE INVENTION

The present invention relates to a monitor apparatus and a monitoring method, and more particularly to a monitor apparatus and a monitoring method for detecting movement behavior of an object in a cylinder.

BACKGROUND OF THE INVENTION

The use of a piston style cylinder is very common in semiconductor processing stations. In the piston style cylinder, a wafer carrier is supported by a piston, and the piston is set to move back and forth between a first position and a second position inside the cylinder. General speaking, wafers are very fragile, so they are expected to move at a constant speed to avoid damage resulting from abrupt acceleration or deceleration of a supporter such as a wafer carrier or a piston. Even though the supporter is initially set to move constantly, as time passes by, sludge might accumulate on the interior walls or at corners of the cylinder, and this would hinder the piston from constant reciprocal movement.

For transferring wafers, air is fed through a valve to a lower section of the cylinder while the piston is moving upward from the first position to the second position, and then exhausted while the piston is moving downward from the second position to the first position.

Meanwhile, air is fed through another valve to an upper section of the cylinder while the piston is moving downward from the second position to the first position, and exhausted while the piston is moving upward from the first position to the second position.

In the prior art, control circuitry with high precision sensors such as linear variable differential transformers (LVDT), voltage meters, or encoders is required for monitoring the status of the piston while the piston is moving back and forth between the first position and the second position. Such sensors are generally cost a lot. Therefore, there is a need to find a less expensive approach for monitoring the movement behavior of the piston in the cylinder.

SUMMARY OF THE INVENTION

Therefore, the present invention provides cost-effective monitor apparatus and method for monitoring movement behavior of an object in a cylinder.

The present invention provides a monitoring method for monitoring a movement behavior of an object in a cylinder. The object is set to move back and forth between a first position and a second position in the cylinder. The method includes steps of: setting a first measurement point between the first position and the second position; obtaining a first counted period indicating a duration that the object moves from the first position to the first measurement point; obtaining a movement behavior parameter according to the first counted period; and determining whether the movement behavior parameter of the object matches a first condition, and generating a first warning message if matching occurs.

The method according to the present invention may further includes steps of: setting a second measurement point between the first position and the second position; obtaining a second counted period indicating a duration that the object moves from the second position to the second measurement point; obtaining a movement behavior parameter of the object according to the second counted period; and determining whether the movement behavior parameter of the object matches a second condition, and generating a second warning message if matching occurs.

The present invention further provides a monitor apparatus for monitoring a movement behavior of an object in a cylinder. The object is set to move back and forth between a first position and a second position in the cylinder. The monitor apparatus includes: a first detecting unit for detecting a first counted period indicating a duration that the object moves from the first position to a first measurement point between the first position and the second position; and a control unit electrically connected to the first detecting unit for obtaining a first movement behavior parameter of the object according to the first counted period, determining whether the first movement behavior parameter of the object matches a first condition, and generating a first warning message if matching occurs.

The present invention may further includes a second detecting unit electrically connected to the control unit for detecting a second counted period indicating a duration that the object moves from the second position to a second measurement point between the first position and the second position. Meanwhile, the control unit further obtains a second movement behavior parameter of the object according to the second counted period, determining whether the second movement behavior parameter of the object matches a second condition, and generating a second warning message if matching occurs.

BRIEF DESCRIPTION OF THE DRAWINGS

The objects and advantages of the present invention will become more readily apparent to those ordinarily skilled in the art after reviewing the following detailed description and accompanying drawings, in which:

FIG. 1A is a schematic diagram exemplifying a position of the first measurement point relative to positions of the first position and the second position for implementing the first stage I of the monitoring method;

FIG. 1B is a plot schematically illustrating various movement behaviors of the piston from the first position to the second position;

DETAILED DESCRIPTION OF PREFERRED EMBODIMENTS

Figures 2A, 2B:
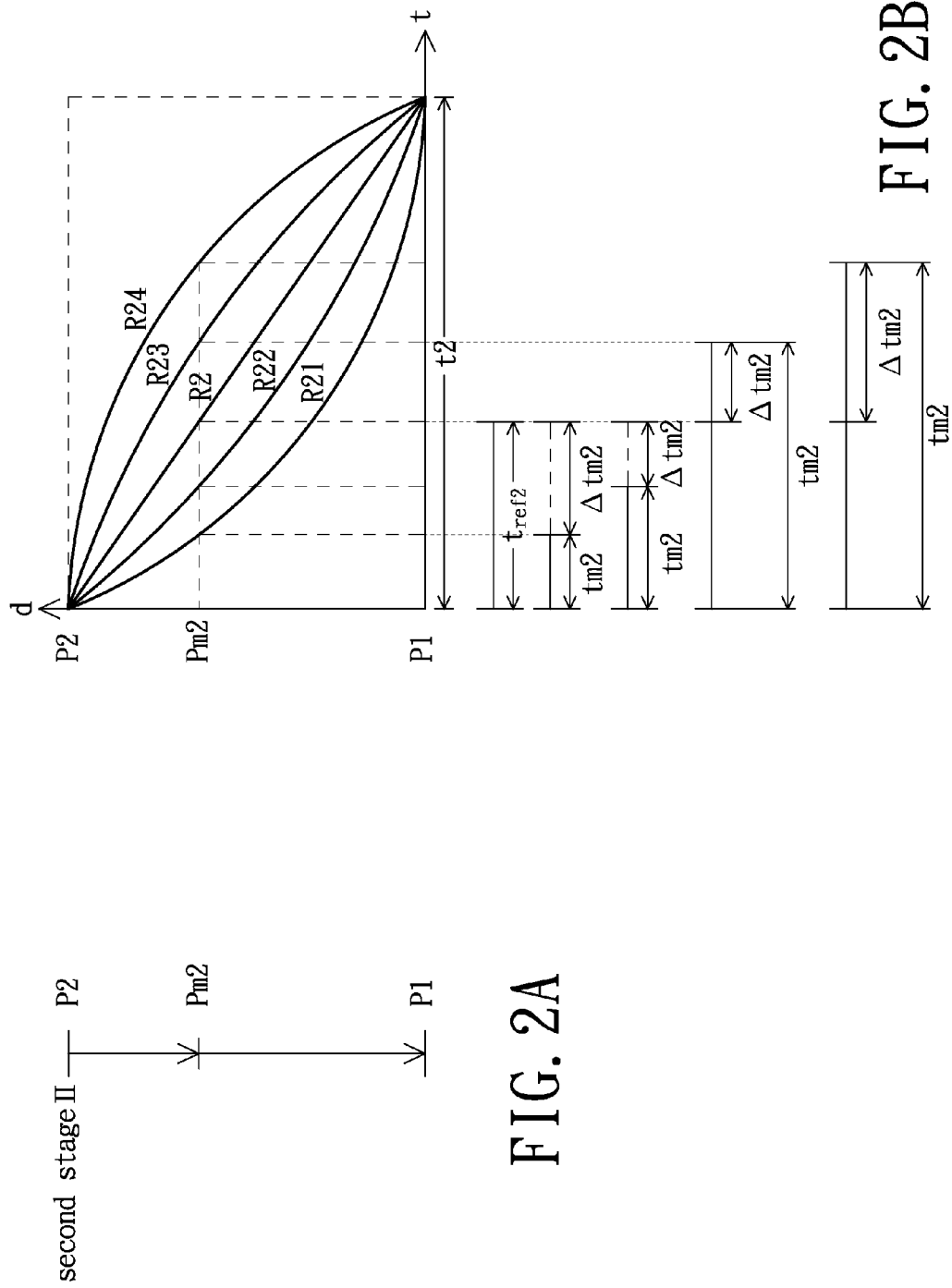
FIG. 2A is a schematic diagram exemplifying a position of the second measurement point relative to positions of the first position and the second position for implementing the second stage II of the monitoring method.
FIG. 2B is a plot schematically illustrating various movement behaviors of the piston from the second position to the first position.

Hereinafter, a monitoring method for detecting the movement behavior of an object in a cylinder according to an embodiment of the present invention is described with reference to FIGS. 1A, 1B, 2A and 2B. In this embodiment, wafers are transferred with a piston type cylinder, and the piston in the cylinder is set to move back and forth between a first position P1 and a second position P2 at a predetermined constant speed. It is to be noted that the term "object" used herein and hereafter may represent a piston, a wafer carrier, a wafer to be transferred or a combination thereof. For illustration purpose, a piston is used as an example.

In this embodiment, the movement of the piston includes two stages, i.e. a first stage I that the piston moves from the first position P1 to the second position P2, as illustrated in FIG. 1A, and a second stage II that the piston moves from the second position P2 to the first position P1, as illustrated in FIG. 1B. In other words, the piston is moving upward during the first stage I, and moving downward during the second stage II. It is to be noted that the first stage I and the second stage II can be sequentially exchanged.

According to the present invention, a reference point between the first position P1 and the second position P2 is picked in either or both of the stages, and movement behavior of the piston passing through the reference point is detected to determine whether abnormal situation occurs. If abnormal situation occurs, a pre-warning mechanism can be actuated in order to prevent from possible wafer damage due to abnormal movement behavior of the piston. For determining whether abnormal situation occurs, a timing factor revealing difference between an ideal movement condition and a real movement behavior parameter is estimated. A warning message is preferably issued when the movement behavior parameter of the piston is deviating from the ideal movement condition but still reliable. Then the user may replace the cylinder before damage is caused.

Referring to FIG. 1A, a first measurement point Pm1 is selected as the reference point for monitoring movement behavior of the piston in the first stage I. The first position P1 is located lower than the second position P2 in the upstanding cylinder. The piston is set to move upward in the direction indicated by the arrows passing through the first measurement point Pm1. A time period actually taken for the piston to move from the first position P1 to the first measurement point Pm1 is counted, and the time period is defined as a first counted period. On the other hand, a time period that the piston ideally moves from the first position P1 to the first measurement point Pm1 at a constant speed is defined as a first reference period $t_{ref1}$. The first counted period is compared with the first reference period to realize how the real movement behavior parameter of the piston deviates from the ideal one. For example, a first time difference $^\Delta tm1$ obtaining by subtracting the first reference period from the first counted period is calculated. If the first time difference $^\Delta tm1$ is beyond a specified range, abnormal status of the movement behavior is determined. Then a warning message will be generated.

FIG. 1B schematically illustrating various movement behaviors of the piston from the first position P1 to the second position P2 through the first measurement point Pm1, which can be referred to see how the real movement behavior parameter deviates from the ideal one. As shown, the linear line R1 indicates an ideal movement behavior, i.e. moving at a constant speed. On the other hand, curves R11, R12, R13 and R14 indicate non-ideal movement behavior in spite the total time for movement from the first position P1 to the second position P2 is identical for all the cases. It is understood from curves R11, R12, R13 and R14 that acceleration and deceleration are involved. For example, the curves R11 and R12 show that the piston is accelerated and then decelerated, and the curves R13 and R14 show that the piston is decelerated and then accelerated. In other words, if the piston moves as indicated by the curve R11 or R12, the first counted period taken for the piston to reach the first measurement point Pm1 will be quicker than the ideal movement condition R1. On the contrary, if the piston moves as indicated by the curve R13 or R14, the first counted period taken for the piston to reach the first measurement point Pm1 will be slower than the ideal movement condition R1. Accordingly, by comparing the first counted period with the first reference period, whether acceleration/deceleration is involved can be realized. Furthermore, according to the time difference between the first counted period and the first reference period, the acceleration/deceleration level can be realized so as to determine the deviation degree is tolerable or not. If the deviation exceeds a threshold, the warning message will be issued so that the operator may deal with the situation properly to avoid damage.

Likewise, as shown in FIG. 2A, a second measurement point Pm2 is selected as the reference point for monitoring movement behavior of the piston in the second stage II. In the second stage II, the piston is set to move downward from the second position P2 to the first position P1 in the direction indicated by the arrows passing through the first measurement point Pm2. A time period actually taken for the piston to move from the second position P2 to the second measurement point Pm2 is counted, and the time period is defined as a second counted period. On the other hand, a time period that the piston ideally moves from the second position P2 to the second measurement point Pm2 at a constant speed is defined as a second reference period $t_{ref2}$. The second counted period is compared with the second reference period to realize how the real movement behavior parameter of the piston deviates from the ideal one. For example, a second time difference $^\Delta tm2$ obtaining by subtracting the second reference period from the second counted period is calculated. If the second time difference $^\Delta tm2$ is beyond a specified range, abnormal status of the movement behavior is determined. Then a warning message will be generated.

FIG. 2B schematically illustrating various movement behaviors of the piston from the second position P2 to the first position P1 through the second measurement point Pm2, which can be referred to see how the real movement behavior parameter deviates from the ideal one. As shown, the linear line R2 indicates an ideal movement behavior, i.e. moving at a constant speed. On the other hand, curves R21, R22, R23 and R24 indicate non-ideal movement behavior in spite the total time for movement from the second position P2 to the first position P1 is identical for all the cases. It is understood from curves R21, R22, R23 and R24 that acceleration and deceleration are involved. For example, the curves R21 and R22 show that the piston is accelerated and then decelerated, and the curves R23 and R24 show that the piston is decelerated and then accelerated. In other words, if the piston moves as indicated by the curve R21 or R22, the first counted period taken for the piston to reach the second measurement point Pm2 will be quicker than the ideal movement condition R2. On the contrary, if the piston moves as indicated by the curve R23 or R24, the second counted period taken for the piston to reach the second measurement point Pm2 will be slower than the ideal movement condition R2. Accordingly, by comparing the second counted period with the second reference period, whether acceleration/deceleration is involved can be realized. Furthermore, according to the time difference between the second counted period and the second reference period, the acceleration/deceleration level can be realized so as to determine the deviation degree is tolerable or not. If the deviation exceeds a threshold, the warning message will be issued so that the operator may deal with the situation properly to avoid damage.

In summary, according to the present invention, an intermediate point in the moving path of an object in a cylinder is selected and a time period of the object to move from a start position to the selected point is counted. Whether a moving behavior parameter of the object is abnormal is then determined based on the counted period. For example, a condition is considered to be matched if the time difference of a reference period and the counted period lies beyond a specified range.

Figure 3:
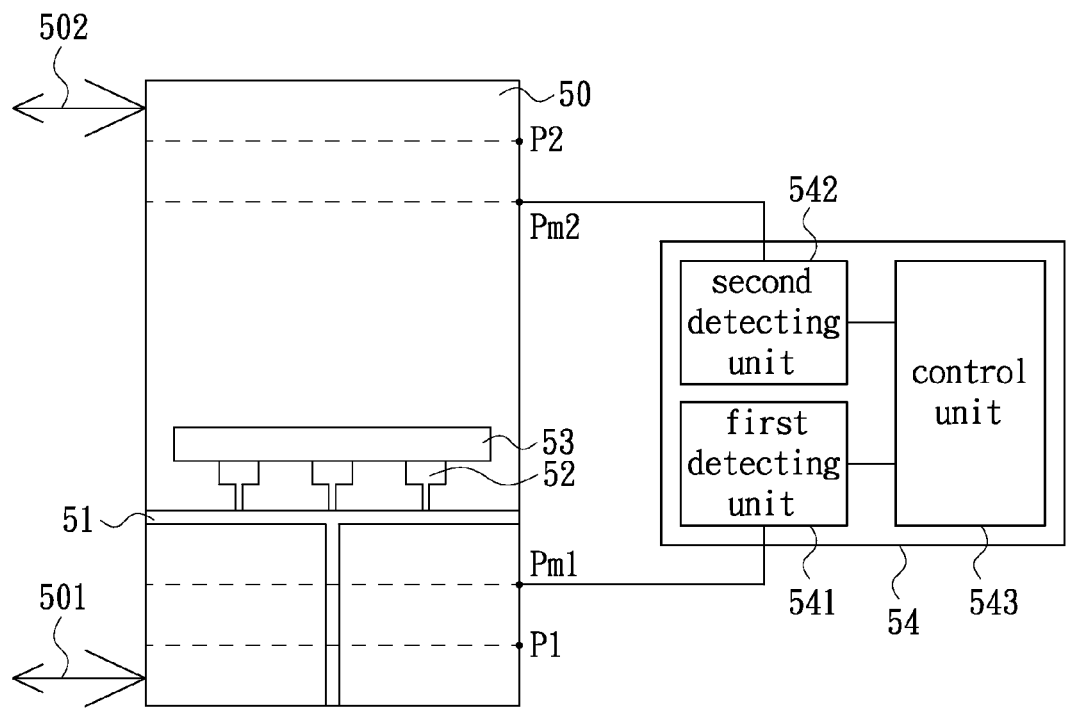
FIG. 3 is a schematic diagram illustrating a monitor apparatus for detecting the movement behavior of an object in a cylinder according to an embodiment of the present invention.

FIG. 3 is a schematic diagram illustrating a monitor apparatus 54 for detecting the movement behavior parameter of a piston 51 in a cylinder 50 according to an embodiment of the present invention. In this embodiment, the movement of the piston 51 in a cylinder 50 enables the movement of the wafer carrier 52 and the wafer 53, and the monitor apparatus 54 monitors the movement behavior parameter of the piston 51, wherein the piston 51 is moving back and forth between the first position P1 and the second position P2 in the cylinder 50. The monitor apparatus 54 comprises: a first detecting unit 541, for detecting a first counted period; a second detecting unit 542, for detecting a second counted period; and a control unit 543. The control unit 543 is electrically connected to the first detecting unit 541 and the second detecting unit 542.

The air pressures of the upper section and the lower section of the chamber 502 are adjusted through the first valve 501 and the second valve 502, respectively. Air is fed through the first valve 501 to the lower section of the cylinder 50 while the piston 51 is moving upward from the first position P1 to the second position P2, and then exhausted while the piston 51 is moving downward from the second position P2 to the first position P1.

Meanwhile, air is fed through the second valve 502 to the upper section of the cylinder 50 while the piston 51 is moving downward from the second position P2 to the first position P1, and exhausted while the piston is moving upward from the first position P1 to the second position P2.

As mentioned above with reference to FIGS. 1A, 1B, 2A and 2B, the first counted period tm1 is counted when the piston 51 moves from the first position P1 to the first measurement point Pm1 in between the first position P1 to the second position P2. The second counted period tm2 is counted when the piston 51 moves from the second position P2 to the second measurement point Pm2 in between the first position P1 and the second position P2. The first counted period tm1 and the second counted period tm2 are referred to for realizing the movement behavior parameter of the piston 51.

The control unit 543 is used for determining whether the movement behavior parameter of the piston 51 matches a first condition, and generating a first warning message if matching occurs. Similarly, the control unit 543 is used for determining whether the movement behavior parameter of the piston 51 matches a second condition, and generating a second warning message if matching occurs.

As known to those skilled in the art, the use of the first detecting unit 541 and the second detecting unit 542 is at a low cost. For example, a photo interrupter may be used as the detecting unit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A monitoring method for monitoring a movement behavior of a wafer carrier comprising at least a wafer in a cylinder, the wafer carrier being set to move back and forth between a first position and a second position in the cylinder, and the monitoring method comprising steps of:

setting a first measurement point between the first position and the second position;
obtaining a first counted period indicating a duration that the wafer carrier moves from the first position to the first measurement point;
obtaining a movement behavior parameter according to the first counted period; and
determining whether the movement behavior parameter of the wafer carrier matches a first condition, and generating a first warning message if matching occurs.

2. The monitoring method according to claim 1, further comprising a step of obtaining a first reference period indicating a duration that the wafer carrier moves at a specified constant speed from the first position to the first measurement point.

3. The monitoring method according to claim 2, the movement behavior parameter is a first time difference between the first reference period and the first counted period.

4. The monitoring method according to claim 3, wherein the first condition is matched if the first time difference lies beyond a specified range.

5. The monitoring method according to claim 1, further comprising steps of:

setting a second measurement point between the first position and the second position;
obtaining a second counted period indicating a duration that the wafer carrier moves from the second position to the second measurement point;
obtaining a movement behavior parameter of the wafer carrier according to the second counted period; and
determining whether the movement behavior parameter of the wafer carrier matches a second condition, and generating a second warning message if matching occurs.

6. The monitoring method according to claim 5, further comprising a step of obtaining a second reference period indicating a duration that the wafer carrier moves at a specified constant speed from the second position to the second measurement point.

7. The monitoring method according to claim 6, wherein the movement behavior parameter is a second time difference between the second reference period and the second counted period.

8. The monitoring method according to claim 7, wherein the second condition is matched if the second time difference lies beyond a specified range.

9. The monitoring method according to claim 1, wherein the first position and the second position are disposed oppositely in upper and lower sections of the cylinder.

10. A monitor apparatus for monitoring a movement behavior of a wafer carrier comprising at least a wafer in a cylinder, the wafer carrier being set to move back and forth between a first position and a second position in the cylinder, the monitor apparatus comprising: a first detecting unit for detecting a first counted period indicating a duration that the wafer carrier moves from the first position to a first measurement point between the first position and the second position; and a control unit electrically connected to the first detecting unit for obtaining a first movement behavior parameter of the wafer carrier according to the first counted period, determining whether the first movement behavior parameter of the wafer carrier matches a first condition, and generating a first warning message if matching occurs.

11. The monitor apparatus according to claim 10, wherein the control unit compares the first counted period with a first reference period indicating a duration that the wafer carrier moves at a specified constant speed from the first position to the first measurement point to obtain the first movement behavior parameter.

12. The monitor apparatus according to claim 11, wherein the first movement behavior parameter is a first time difference between the first reference period and the first counted period.

13. The monitor apparatus according to claim 12, wherein the control unit determines that the first condition is matched if the first time difference lies beyond a specified range.

14. The monitor apparatus according to claim 10, wherein the monitor apparatus further comprising: a second detecting unit electrically connected to the control unit for detecting a second counted period indicating a duration that the wafer carrier moves from the second position to a second measurement point between the first position and the second position; wherein the control unit further obtains a second movement behavior parameter of the wafer carrier according to the second counted period, determining whether the second movement behavior parameter of the wafer carrier matches a second condition, and generating a second warning message if matching occurs.

15. The monitor apparatus according to claim 14, wherein the control unit compares the second counted period with a second reference period indicating a duration that the wafer carrier moves at a specified constant speed from the second position to the second measurement point to obtain the second movement behavior parameter.

16. The monitor apparatus according to claim 15, wherein the second movement behavior parameter is a second time difference between the second reference period and the second counted period.

17. The monitor apparatus according to claim 16, wherein the control unit determines that the second condition is matched if the second time difference lies beyond a specified range.

* * * * *